US005488328A

United States Patent [19]

Ludwig et al.

[11] Patent Number: 5,488,328

[45] Date of Patent: Jan. 30, 1996

[54] CONSTANT CURRENT SOURCE

[75] Inventors: Michael Ludwig; Rolf Reber, both of Ulm; Heinz-Peter Feldle, Senden, all of Germany

[73] Assignee: Deutsche Aerospace AG, Munich, Germany

[21] Appl. No.: 326,497

[22] Filed: Oct. 20, 1994

[30] Foreign Application Priority Data

Oct. 20, 1993 [DE] Germany .......................... 43 35 683.4

[51] Int. Cl.[6] ................................ G05F 1/10; G05F 3/04; H01L 35/00

[52] U.S. Cl. .......................... 327/538; 327/541; 327/543; 327/513; 323/312

[58] Field of Search .................................... 327/108, 530, 327/535, 537, 538, 541, 543, 512, 513; 323/312

[56] References Cited

U.S. PATENT DOCUMENTS

| | | | |
|---|---|---|---|
| 4,642,552 | 2/1987 | Suzuki et al. | 323/312 |
| 4,716,356 | 12/1987 | Vyne et al. | 323/312 |
| 4,760,284 | 7/1988 | Taylor | 327/541 |
| 5,065,043 | 11/1991 | Bartling et al. | 327/543 |
| 5,166,553 | 11/1992 | Kotera et al. | 327/312 |

FOREIGN PATENT DOCUMENTS

| | | | |
|---|---|---|---|
| 353039 | 1/1990 | European Pat. Off. . | |
| 1061124 | 12/1983 | U.S.S.R. | 323/312 |
| 2211321 | 12/1988 | United Kingdom . | |
| 2211322 | 6/1989 | United Kingdom . | |

OTHER PUBLICATIONS

Toumazou C et al., "Design and Application of Gaas Mesfet Current Mirror Circuits", IEE Proceedings G. Electronic Circuits & Systems, vol. 137, No. 2, Part G, Apr. 1, 1990, pp. 101–108.

Lange, K. and K.–H. Löcherer, *Taschenbuch Der Hochfrequenztechnik, Band 2: Komponenten,* Springer–Verlag (1986) pp. M22–M23.

*Primary Examiner*—Timothy P. Callahan
*Assistant Examiner*—Trong Phan
*Attorney, Agent, or Firm*—Spencer & Frank

[57] ABSTRACT

A constant-current source that contains two substantial identical field effect transistors as well as a simple resistance network. The actual saturation current of one of the field effect transistors is measured and converted by the resistance network into a control voltage for the other field effect transistor which produces the desired constant current. With such a circuit, production tolerances, especially tolerances for field effect transistor, as well as operation-dependent temperature variations can be compensated for within a wide range.

11 Claims, 1 Drawing Sheet

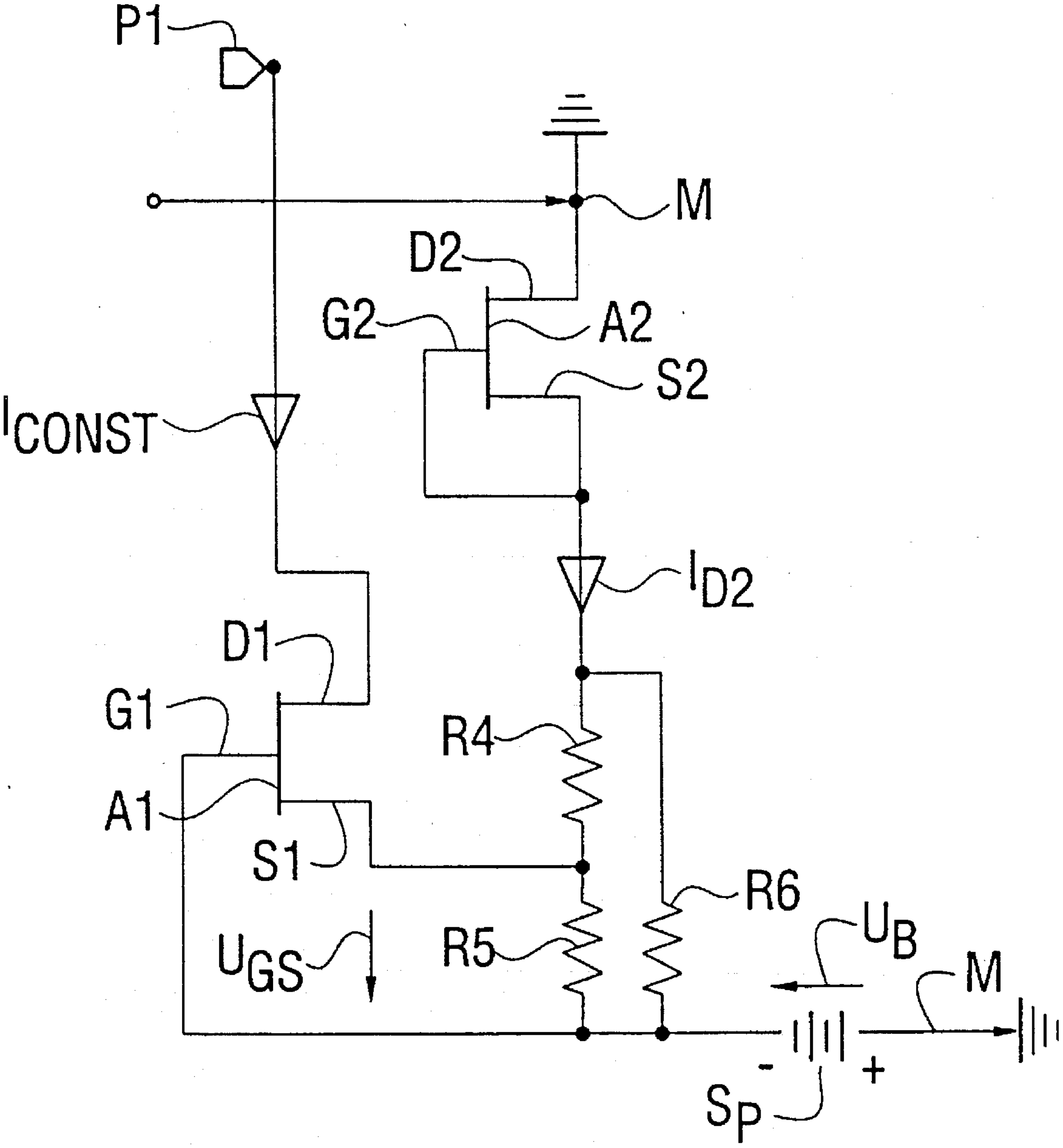
P1
M
D2
G2
A2
S2
$I_{CONST}$
$I_{D2}$
D1
G1
A1
S1
R4
R5
R6
$U_{GS}$
$U_B$
M
-
+
$S_P$

CONSTANT CURRENT SOURCE

REFERENCE TO RELATED APPLICATIONS

This application claims the priority of German application Serial No. P 43 35 683.4 filed Oct. 20, 1993, which is incorporated herein by reference.

BACKGROUND OF THE INVENTION

The invention is based on a constant-current source with an adjustable constant current generated with the aid of at least one semiconductor component.

A constant-current source is required for many circuit arrangements, particularly in electronics. This constant-current source has a very high internal resistance, which should be infinite in theory. It is possible to implement such a constant-current source by means of semiconductor components, e.g., as a so-called current mirror circuit, which is known, e.g., from the book by Meinke, Gundlach: Taschenbuch der Hochfrequenztechnik (Pocket Book for High-Frequency Engineering), 4th edition (1986), p. M22–M23.

It is the object of the present invention to provide a constant-current source of the generic type which can be produced with integrated technology with the aid of at least one field effect transistor.

SUMMARY OF THE INVENTION

The above object generally is achieved according to the present invention by a constant-current source with an adjustable constant current which comprises: first and second field effect transistors having the same electrical behavior, and in which the saturation current ($I_{DSS}$) is proportional to the pinch-off voltage ($U_p$), with each field effect transistor having a respective source, drain and gate; a voltage divider circuit including a series connection of the first field effect transistor having its drain connected to one pole of a voltage source and which is connected as a current source with its source and gate connected together, and at least one adjustable ohmic resistance connected between the source of the first field effect transistor and the other pole of the voltage source; and, the second field effect transistor has its gate connected to the other pole of the voltage source, its source connected to the resistance such that a portion of the resistance is present between its gate and its source, and with the resistance portion being a function of the constant current ($I_{const}$) to be adjusted and which is to flow via the drain of the second field effect transistor to a component meant for the constant current ($I_{const}$) to be connected to the drain of the second field effect transistor. Advantageous developments and or modifications can be taken from the dependent claims.

A first advantage of the invention is that a predeterminable constant current is adjustable in a technically simple and cost-effective manner.

A second advantage is that, within broad limits, the constant current that has been set is almost independent of the production process of the field effect transistors and thus of their electric properties.

A third advantage is that, within broad limits, the constant current that has been set is almost independent of the temperature-dependent electric properties of the field effect transistors.

A fourth advantage is that only a single type of field effect transistor is necessary.

A fifth advantage is that, in addition to the two field effect transistors, only ohmic resistances are required, which can be produced with integrated technology in a cost-effective manner.

A sixth advantage is that the circuit arrangement according to the present invention as described in the following can be integrated in a reliable and cost-effective manner into integrated circuits produced with GaAs technology, e.g. high-frequency circuits.

Further advantages ensue from the description below wherein the invention is described in greater detail by way of an embodiment with reference to the drawings.

BRIEF DESCRIPTION OF THE DRAWINGS

The FIGURE is a schematic circuit diagram of a preferred embodiment of a constant current source according to the invention.

DETAILED DESCRIPTION OF THE PREFERRED EMBODIMENT

In the following, the term field effect transistor is abbreviated with FET. This abbreviation is commonly known to a person skilled in the art.

The example explained in the following is based on the use of two n-channel JFET's. A person skilled in the art, however, is familiar with constructing a corresponding circuit with the aid of p-channel JFET's so that the invention also comprises this letter type JFET as well.

The FIGURE shows two n-channel JFET's A1, A2 which are produced on a semiconductor substrate in the same production process and have the same electrical behavior. Both JFET's A1, A2 are provided with essentially the same pinch-off voltage $U_p$ as well as with essentially the same saturation current $I_{DSS}$. For the latter, a substantially larger magnitude is selected than for the constant current $I_{const}$ to be adjusted, e.g., $I_{DSS}>5.I_{const}$. The positive pole (+) of the voltage source SP, e.g., a 7-Volt voltage source, is connected to the circuit ground M so that a negative voltage source is created. A voltage divider is connected between the poles of the source SP, with this voltage divider consisting of the series connection of a resistance network R4, R5, R6 and the JFET A2, with the JFET A2 being itself connected such that the saturation current $I_{D2}=I_{DSS}$ flows through it. This drain current $I_{D2}=I_{DSS}$ only depends on the properties of the JFET A2, e.g., its instantaneous temperature. In order to be able to utilize this dependence, the JFET A2 is switched as a current source. For this purpose, the JFET A2 has its drain D2 applied or connected to ground M, its gate G2 and source S2 connected to each other and to one end connection of the resistance network R4 to R6, whose other end connection is connected to the negative pole (–) of the source Sp. The ohmic resistance network R4 to R6 consists of a series connection of the ohmic resistances R4 and R5 that are bridged by the ohmic resistance R6. When the drain current $I_{D2}$ now flows through this resistance network, a control voltage $U_{GS}$ is created across the resistance R5 which is dependent on this resistance and on the drain current $I_{D2}$, through which the constant current $I_{const}$ flowing through the JFET A1 can be adjusted. For this purpose, the gate G1 of the JFET A1 is connected to the negative pole (–), as is the end connection of the resistance R5. The source S1 of the JFET A1 is connected to the other end of resistance R5, i.e., the end connected to resistance R4. Drain D1 of JFET A1 is connected to a connection P1 to which a circuit arrangement (not shown), through which the constant current $I_{const}$ is to flow, can be connected. Therefore, at gate G1 of the JFET A1, a negative voltage $U_{GS}$ vis-a-vis source S1 is created which controls JFET A1 in an optimum manner.

Thus, the JFET A2 always measures the actual saturation current $I_{DSS}$ which, in particular, is a function of the production process and the actual temperature, and it is converted particularly by resistance R5 into a voltage $U_{GS}$ controlling the JFET A1. It can be seen that the desired constant current $I_{const}$ can be adjusted by means of a change of particularly resistance R5.

For a constant current $I_{const}$, chosen on an exemplary basis, the following values apply to the arrangement described:

Working voltage $U_B$=−7 V;

Pinch-off voltage $U_p$ of JFET's A1, A2: $U_p$=−1.2 V;

Saturation current $I_{DSS}$ of JFET's A1, A2: $I_{DSS}$=7.3 mA;

with the ohmic resistances R4=1300 Ω, R5=300 Ω, R6=700 Ω, a control voltage of $U_{GS}$=0.7 V results.

It is particularly advantageous that the constant current $I_{const}$ remains essentially unchanged if the resistance values of resistances R4 to R6 do not change, even if the pinch-off voltage $U_p$ and the saturation current $I_{DSS}$ change within a wide range, e.g., $-1.4\ V \leqq U_p \leqq -1\ V$; $6\ mA \leqq I_{DSS} \leqq 8.5\ mA$.

Such large tolerance ranges of approx. ±20% may occur in the production of JFET's and, advantageously, do not necessitate later adjustment of the circuit described. The resistance network R4 to R6 can therefore be calculated as a function of the desired constant current $I_{const}$. Therefore, the resistances R4 to R6 can, e.g., be produced in an integrated manner without the necessity of later alignment.

Such large tolerance ranges occur particularly in GaAs technology, especially in high and/or extremely high frequency circuits, e.g., so-called millimeter wavelength circuits. The circuit arrangement described can be produced in MESFET technology for GaAs technology so that, advantageously, an integration into monolithic and/or hybrid-integrated extremely high frequency components is possible. The arrangement described can, e.g., produce a level converter circuit which is described in more detail in the commonly assigned concurrently filed U.S. patent application Ser. No. 08/326,496, which corresponds to German Patent Application No. P 43 35 684.2, filed Oct. 20, 1993, and which is incorporated herein by reference.

The invention is not limited to the embodiment described but can be analogically applied to further embodiments. For example, resistances R4 and R5, can be configured as a potentiometer, whose center tap is connected to the source S1 of the JFET A1. In this manner, a continuous adjustment of the constant current $I_{const}$ is possible within predeterminable limits.

The invention now being fully described, it will be apparent to one of ordinary skill in the art that any changes and modifications can be made thereto without departing from the spirit or scope of the invention as set forth herein.

What is claimed:

1. A constant-current source with an adjustable constant current comprising, in combination:

first and second field effect transistors having the same electrical behavior, and in which the saturation current ($I_{DSS}$) is proportional to the pinch-off voltage ($U_p$), each field effect transistor having a respective source, drain and gate;

a voltage divider circuit including a series connection of said first field effect transistor, having its drain connected to one pole of a voltage source and which is connected as a current source with its source and gate connected together, and at least one ohmic resistance connected between said source of said first field effect transistor and the other pole of said voltage source; and, said second field effect transistor has its gate connected to said other pole of said voltage source, its source connected to said resistance such that a portion of said resistance is present between its said gate and its said source and with said resistance portion being a function of the constant current ($I_{const}$) to be adjusted and which is to flow via said drain of said second field effect transistor to a component meant for the constant current ($I_{const}$) to be connected to said drain of said second field effect transistor.

2. The constant-current source according to claim 1, wherein: said resistance comprises a series connection of two resistances and a third resistance connected in parallel with said two resistances; and one of said two resistances constitutes said portion of said resistance present between said gate and said source of said second field effect transistor.

3. The constant-current source according to claim 2, wherein both of said field effect transistors have a saturation current ($I_{DSS}$) that is considerably larger than the maximum constant current ($I_{const}$) to be adjusted.

4. The constant-current source according to claim 1, wherein both of said field effect transistors have a saturation current ($I_{DSS}$) that is considerably larger than a maximum constant current ($I_{const}$) to be adjusted.

5. The constant-current source according to claim 1, wherein said field effect transistors are integrated transistors of a common integrated circuit.

6. The constant-current source according to claim 1, wherein said field effect transistors are junction field effect transistors.

7. The constant-current source according to claim 6, wherein at least said junction field effect transistors are produced by GaAs technology.

8. The constant-current source according to claim 6, wherein at least said junction field effect transistors are produced by way of MESFET technology.

9. The constant-current source according to claim 1, wherein at least said field effect transistors are produced by GaAs technology.

10. The constant-current source according to claim 1, wherein: said field effect transistors are n-channel field effect transistors; and said other pole of said voltage source is a negative pole.

11. The constant-current source according to claim 10, wherein said one pole of said voltage source is connected to ground.

* * * * *